United States Patent [19]

Swartz et al.

[11] 4,359,773
[45] Nov. 16, 1982

[54] SEMICONDUCTOR LASERS WITH SELECTIVE DRIVING CIRCUIT

[75] Inventors: Robert G. Swartz, Highlands; Ping K. Tien, Chatham Township, Morris County; Bruce A. Wooley, Tinton Falls, all of N.J.

[73] Assignee: Bell Telephone Laboratories, Incorporated, Murray Hill, N.J.

[21] Appl. No.: 166,045

[22] Filed: Jul. 7, 1980

[51] Int. Cl.³ ............................................... H01S 3/10
[52] U.S. Cl. ...................................... 372/26; 372/29; 372/43
[58] Field of Search ................... 331/94.5 M, 94.5 SH; 455/609–612; 350/96.17, 96.20

[56] References Cited

U.S. PATENT DOCUMENTS

| 4,009,385 | 2/1977 | Sell | 331/94.5 M |
| 4,019,048 | 4/1977 | Maione et al. | 331/94.5 M |
| 4,168,427 | 9/1979 | Hubbard | 455/606 |

OTHER PUBLICATIONS

"GaAs Laser Source Package for Multichannel Optical Links"; Crow et al.; *Optical Fiber Trans. II Tech. Digest by Opt. Soc. of America* 1977, 22–24 Feb.

"GaAlAs Laser Transmitter for Lightwave Trans. Systems"; Shumate et al., *Bell Syst. Tech. Jour.*; vol. 57, No. 6; Jul.-Aug. 1978, pp. 1823–1836.

"Electronic Circuits for High Bit Rate Digital Fiber Opt. Comm. Systems", by Gruber et al., *IEEE Trans. on Communications*, vol. COM-26, No. 7, Jul. '78, pp. 1088–1098.

"Simultaneous Feedback Control of Bias and Modulation Currents for Injection Lasers", by Chen; *Electronics Letters*, vol. 16, No. 1, Jan. '80, pp. 7–8.

"Transmitter Feedback Techniques Stabilize Laser-Diode Output", by Svacek, *Electronics Design News;* Mar. 1980, pp. 107–110.

"Star Couplers Using Fused Biconically Tapered Multimode Fibers", Rawson et al., *Electronics Letters*, vol. 14, No. 9; 1978, pp. 274–275.

"Fiber-Optic Cable to go to Sea for Phone Company", by Hindin *Electronics*, Mar. 1980, pp. 39–40.

*Primary Examiner*—William L. Sikes
*Assistant Examiner*—Leon Scott, Jr.
*Attorney, Agent, or Firm*—Daniel D. Dubosky; Erwin W. Pfeifle

[57] ABSTRACT

A plurality of semiconductor lasers (431–434) and a photodetector (120) are mounted on a silicon substrate (100) having an integrated circuit (101) fabricated therein. The integrated circuit includes a biasing circuit (405) for establishing a threshold current level that is dependent on the output of the photodetector and a modulator circuit (404) for providing a modulation current that is dependent on the digital values in an input signal. A semiconductor switch (406) selects only one of the plurality of semiconductor lasers for activation by the biasing and modulator circuits. The integrated circuit also includes a circuit (408) that operates the semiconductor switch so as to selectively activate a different one of the plurality of semiconductor lasers in response to either a predetermined output from said photodetector or in response to an external supervisory signal.

13 Claims, 7 Drawing Figures

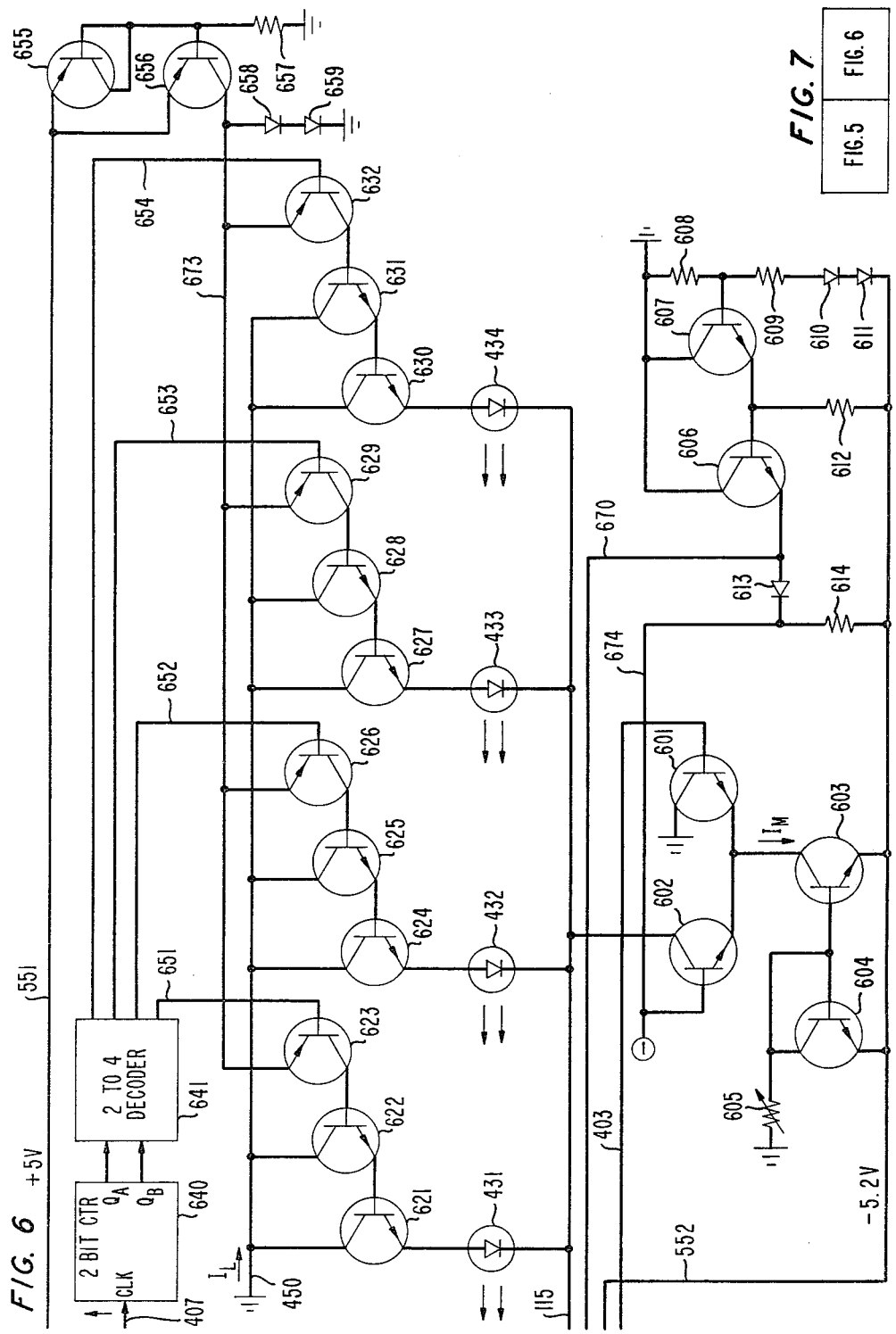

SEMICONDUCTOR LASERS WITH SELECTIVE DRIVING CIRCUIT

BACKGROUND OF THE INVENTION

This invention relates to semiconductor laser sources and, more particularly, to semiconductor laser sources that are useful in communication systems.

An important quality of elements that are used in a communication system is the lifetime of the component. In systems such as submarine cable transmission systems, the lifetime of the components may dictate whether or not the communication system is economically feasible relative to other types of communications. One impediment to the immediate use of optical components in a submarine cable system has been the lifetime of the semiconductor laser. In order to achieve the wavelength at which an optical fiber exhibits its lowest transmission loss, the semiconductor laser should be constructed of materials from the indium, gallium, arsenic, phosphorous material system. Unfortunately, the lifetime of these lasers is not sufficiently long as yet to warrant their use in a submarine cable system.

In order to minimize the amount of delay that exists between the electrical pulse and the light pulse that corresponds to the electrical pulse, the semiconductor laser is usually biased at a threshold level at which the laser output begins to sharply increase. This threshold level is not only a function of the individual laser but is also a function of both temperature and time. In order to ensure that the laser is always properly biased at a correct threshold level, circuits in the prior art have been proposed and utilized to control the threshold level as a function of the laser output light level. Some of these circuits also control the extinction ratio, that is, the ratio between the peak light intensity output to the low level light intensity output. This latter control of the extinction ratio is also achieved through a utilization of a feedback circuit. Typically both of the feedback circuits receive their input signal from a photodetector which is properly placed to sample the output light from the semiconductor laser. In many cases this photodetector is positioned so as to receive the light emitted from the end of the laser that is opposite to the end that provides the light input to an optical fiber. One such typical circuit can be found in the article entitled "GaAlAs Laser Transmitter For Lightwave Transmission Systems", by P. W. Shumate, Jr. et al, *Bell System Technical Journal* Vol. 57, No. 6 (July–August 1978) pp. 1823–1836.

The prior art has also recognized that a multilaser source package can be placed on silicon which serves as a substrate for both the laser array and other optical components. See, for example, the digest entitled "GaAs Laser Source Package for Multichannel Optical Links", by J. D. Crow et al, pp. WB6-1-WB6-3 in the *Optical Fiber Transmission II Technical Digest*, Williamsburg, Virginia, Feb. 22–24, 1977. In the Crow et al talk, it was pointed out that this silicon substrate can also serve as the substrate for the individual laser drive electrodes and additional electronic circuitry that may be used to drive the multilaser source package. The lasers in the Crow et al apparatus appear, however, to function simultaneously with each laser delivering its output to an individual fiber light guide. There is no suggestion as to how this laser array can be utilized to provide a laser source with an extended life for use in systems such as submarine cable transmission systems.

SUMMARY OF THE INVENTION

A source of laser light with significantly longer lifetimes is provided in accordance with the present invention wherein a bank of several semiconductor lasers and a single elongated photodetector are bonded to electrodes on a silicon substrate having an electronic integrated circuit. A plurality of optical fibers equal in number to the individual lasers in the bank of lasers are positioned so as to receive the light emitted from each of the semiconductor lasers. These fibers are combined into a single fiber by means of an optical coupler such as a STAR coupler. The electronic integrated circuit uses the signal provided by the photodetector to bias and modulate one of the semiconductor lasers. In response to a decrease in the light output from the selected semiconductor laser, the integrated circuit automatically switches the bias and modulator circuitry to a different one of the plurality of semiconductor lasers in the bank of semiconductor lasers. The circuitry used in the integrated circuit is carefully designed such that it can be totally constructed using bipolar technology in the silicon substrate. As a result, a totally integrated laser source with automatic threshold control and automatic switching is provided on a single silicon substrate.

It is an additional feature of the present invention that the bias and modulator circuitry can be switched to a different semiconductor laser in response to an external switching control signal. This feature can be utilized to externally switch to a different laser in the event that certain types of failures should occur in the automatic switching system.

BRIEF DESCRIPTION OF THE DRAWINGS

The above-stated advantages and others will be more thoroughly understood after reading the following detailed description when taken in conjunction with the drawings wherein:

FIGS. 5–7 are detailed schematic diagrams of the apparatus illustrated in FIG. 4.

DETAILED DESCRIPTION

Figure 1:
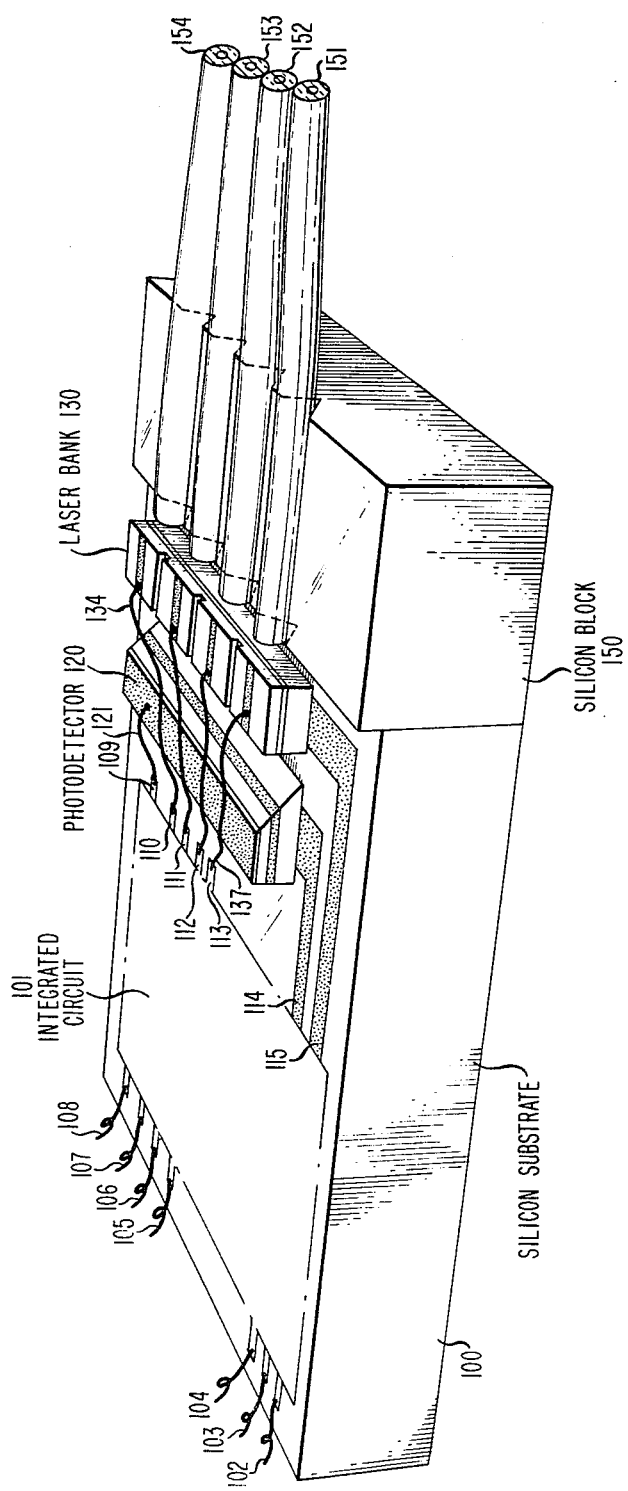
FIG. 1 is a pictorial representation of a source of laser light constructed in accordance with the present invention.

FIG. 1 is a pictorial representation of an apparatus constructed in accordance with the present invention. In FIG. 1 a silicon substrate is prepared by fabricating an integrated circuit of the type described hereinafter in connection with FIGS. 4 and 5 into a top surface of the silicon substrate. This integrated circuit 101 has input and output terminals 102–113 to which external elements can be connected. In addition conductive paths 114 and 115 are extended from integrated circuit 101 toward the opposite end of silicon substrate 100. These conductive paths 114 and 115 are extended along the surface of silicon substrate 100 in a manner such that a photodetector 120 and a laser bank 130 can be bonded to the conductive paths. Details of photodetector 120 and laser bank 130 will be given hereinafter in connection with FIGS. 2 and 3 of the drawings. At this point it need only be appreciated that laser ban 130 consists of four separate laser sources that are constructed on a single substrate and electrically isolated from each other by a silicon nitride layer on the top surface of the laser bank. Electrical conductors 134–137 are bonded to each one of the semiconductor lasers through a metallic contact at the top of the laser. The bottom surface of the laser bank 130 consists of a continuous tin-nickel-gold contact. Photodetector 120 is positioned on the silicon substrate 100 such that its photosensitive layer receives light from any one of the active regions in the laser bank. An electrical conductor 121 connects the top surface of photodetector 120 to input terminal 109 of integrated circuit 101. The entire bottom surface of photodetector 120 consists of a gold, nickel/tin, gold contact. The bottom contact layers of photodetector 120 and laser bank 130 are bonded to the conductive paths 114 and 115, respectively, by evaporating a 3 micrometer thick layer of Sn on both optical elements, and lightly pressing both of these optical elements onto the silicon substrate 100 while heating the substrate to a temperature of about 230° C.

A second silicon substrate 150 to hold optical fibers is first prepared by cutting notches or V-shaped grooves in its top surface, the separation between adjacent notches being equal to the separation between active emitting regions of the semiconductor lasers in the laser bank 130. Optical fibers 151–154 are then cemented into these notches of the substrate 150. These optical fibers can be combined into a single output optical fiber through use of a STAR coupler. For details on the construction of a STAR coupler, see E. G. Rawson and A. B. Nafarrate, "STAR Couplers using Fused Biconically Tapered Multimode Fibres," *Electronics Letters,* Vol. 14, No. 9, p. 274–275 (1978). After the optical fibers 151–154 have cemented to the carefully aligned V-shaped grooves of the substrate, the entire structure is then cemented to silicon substrate 100 while aligning the fibers so as to receive the maximum amount of light output from the lasers in laser bank 130.

Figure 2:
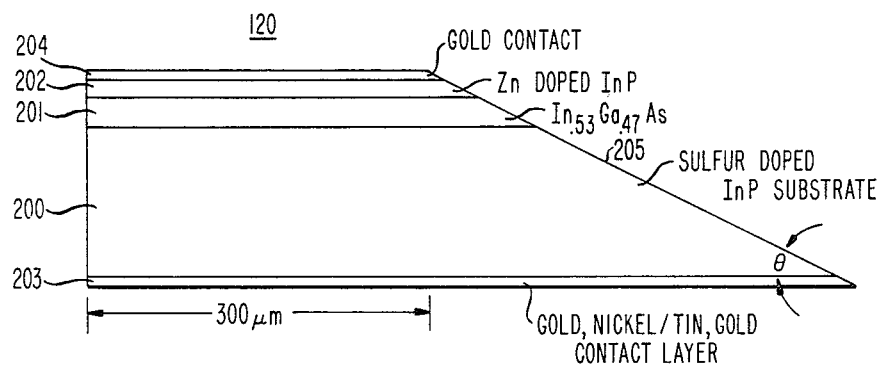
FIG. 2 is a cross sectional diagram of the photodetector illustrated in FIG. 1.

The construction of photodetector 120 is illustrated in FIG. 2 of the drawings. A sulphur doped indium phosphide substrate 200 with a doping density equal to about $10^{+17} cm^{-3}$ has an undoped layer 201 of $In_{0.53}Ga_{0.47}As$ epitaxially grown on its surface. This undoped layer 201 ($n \leq 10^{15} cm^{-3}$) is grown to a thickness of about 2 micrometers. A third layer 202 of InP is grown to a thickness of about 1 micrometer with a zinc doping equal to about $10^{+18} cm^{-3}$. The bottom surface of this structure is coated with a gold, nickel/tin, gold contact layer 203 and the top surface is coated with a gold contact layer 204. The entire structure is advantageously cut such that the one side surface 205 of the structure has an acute angle $\theta$ with respect to the bottom surface. As a result of this tapered side surface, light that is reflected from this surface will not be coupled back into the active region of the selected semiconductor laser but instead will be reflected at an upward angle away from the laser bank 130.

Figure 3:
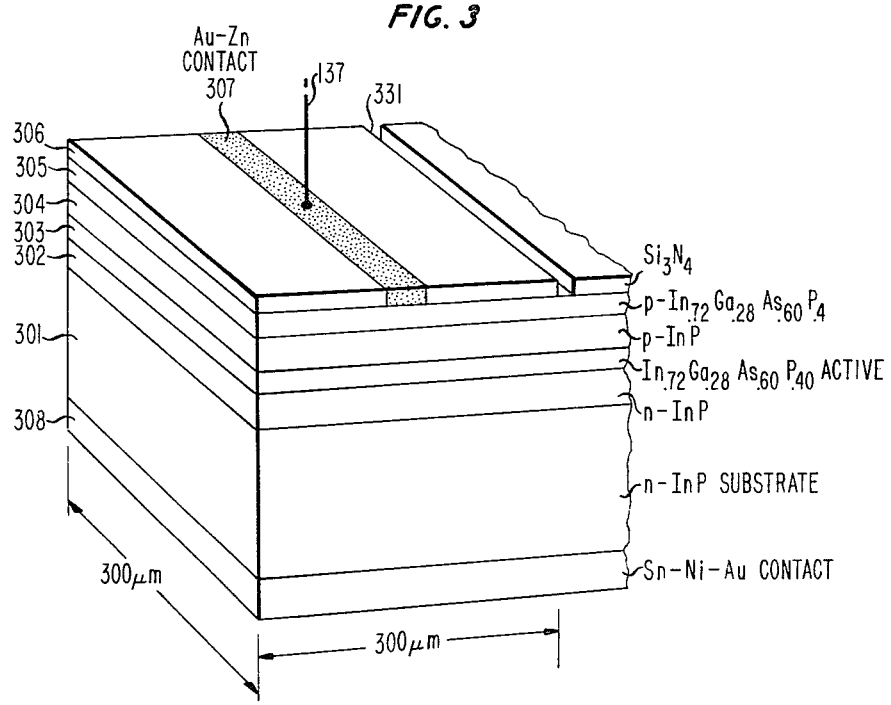
FIG. 3 is a pictorial representation of one of the plurality of semiconductor lasers illustrated in FIG. 1.

A section of laser bank 130 illustrating one of the laser sources is shown in FIG. 3. As indicated in FIG. 3 an epitaxial layer 302 about 10 micrometers thick of InP ($n=10^{17}cm^{-3}$,Sn doped) is grown on an indium phosphide substrate 301 ($n=10^{18}cm^{-3}$,Sn doped). An active layer 303 of $In_{0.72}Ga_{0.28}As_{0.60}P_{0.40}$ (undoped) is then epitaxially grown on layer 302 to a thickness of approximately 0.25 micrometers. This active region layer 303 is then followed by a p-type InP layer 304 ($p=10^{17}cm^{-3}$, Zn doped) having a thickness of approximately 2 micrometers. Finally, a top layer 305 of $In_{0.72}Ga_{0.28}As_{0.60}P_{0.40}$ ($p=10^{17}cm^{-3}$,Zn doped) is epitaxially grown on layer 304 with a thickness of approximately 0.5 micrometers. A silicon nitride ($Si_3N_4$) insulating layer 306 is then placed over the entire top surface of the laser array. This insulating layer is subsequently etched at selected regions along the length of the laser array in order to provide gaps in the insulating layer into which a gold/zinc contact 307 can be deposited. This contact has a width of approximately 15 micrometers. The entire bottom surface of the laser bank 130 is covered with a tin-nickel-gold contact 308. Finally, the cuts are made in the silicon nitride insulating layer (one of which is shown as 331 in FIG. 3) in order to ensure that any stray, improperly placed gold/zinc contact material has not established a leakage path between adjacent contact layers of adjacent laser sources in laser bank 130. Each laser source has a width of approximately 300 micrometers between the cuts in the insulating layer and the length of each laser source is also approximately 300 micrometers. With the above-stated crystalline compositions each laser source will emit radiation having a wavelength of about 1.3 micrometers.

Figure 4:
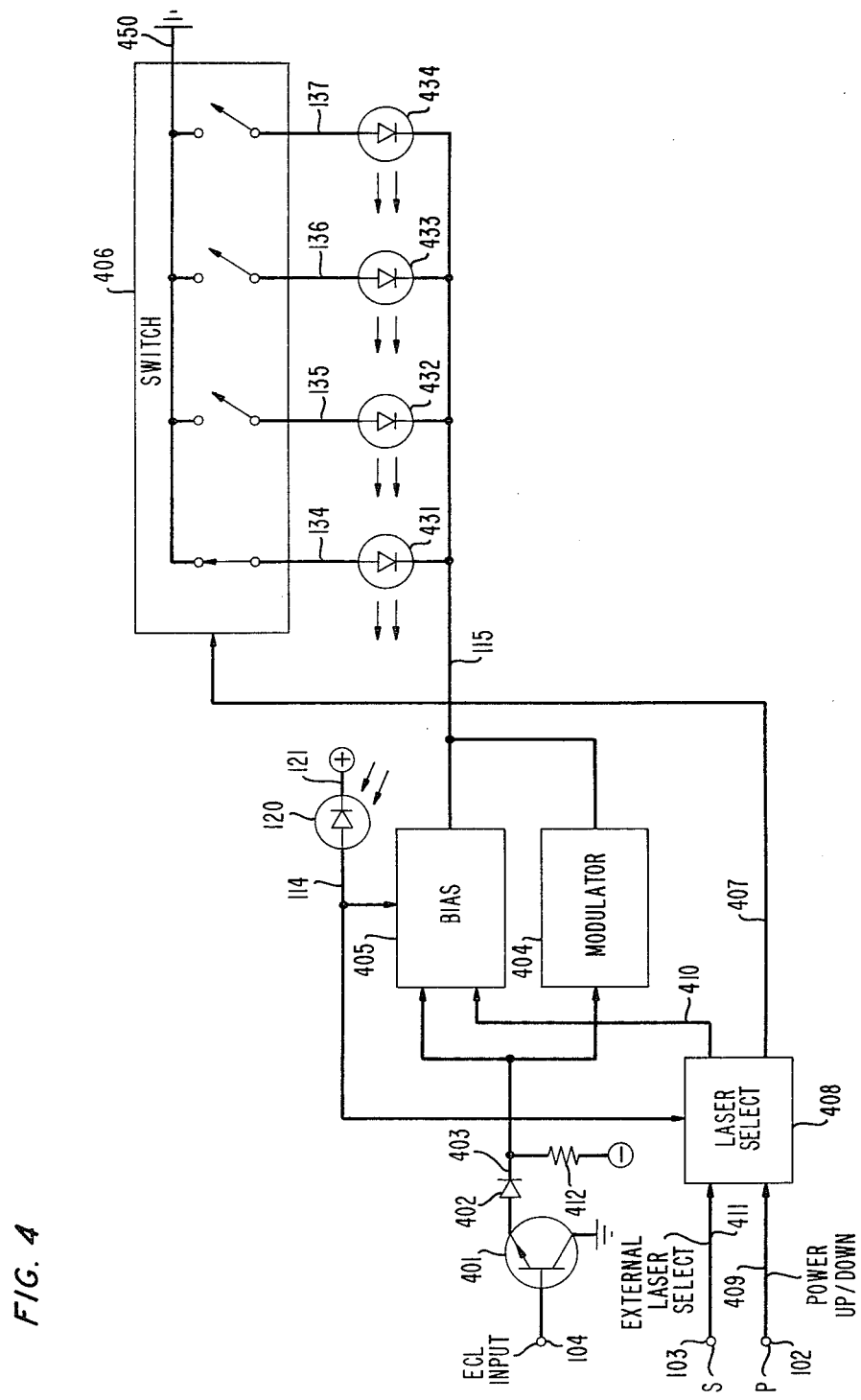
FIG. 4 is a schematic block diagram of the electrical circuitry of the apparatus illustrated in FIG. 1.

Each of the laser sources in laser bank 130 is driven by electrical signals from integrated circuit 101 in FIG. 1 which in turn is shown in schematic block diagram form in FIG. 4. Each laser source of laser bank 130 is shown as an electrically separated laser source 431–434 in FIG. 4. The individual driving conductors 134–137 and the common conductor 115 are given the same designations in FIG. 4 as they were given in FIG. 1. Similarly, photodetector 120 is also shown in FIG. 4 with its connecting wire 121 and conductive path 114 having designations identical to those which were given in FIG. 1.

An emitter-coupled logic (ECL) signal bearing the information that is to be transmitted in optical form is coupled to the input terminal 104 in FIG. 4. This input terminal 104 is coupled to the base of a transistor 401 which simply translates this signal by way of a diode 402 into a input signal having different voltage levels on line 403. This translated input signal is coupled by way of line 403 to the input of a modulator circuit 404 and to the input of a biasing circuit 405 both of which are connected by way of line 115 to the cathode terminal of each of the semiconductor laser diodes 431–434. The anode side of each of these semiconductor lasers is connected to one input of a selective switch 406. As indicated in FIG. 4, switch 406 connects only one of the laser diodes through to a ground potential by way of line 450. Switch 406 is reponsive to positive going transitions that are presented to it by way of a control line 407. Each positive going transition on line 407 will cause switch 406 to connect a different one of the semiconductor laser diodes through to ground potential. In this way only one of the laser diodes is permitted to be connected to the electronic control circuitry during any given time.

Biasing circuit 405 is constructed so as to draw a current by way of line 115 which will place the operating laser diode at a threshold level corresponding to the low light level output. This biasing circuit 405 is in turn responsive to the current provided by photodetector 120 on line 114. As indicated in FIG. 1, photodetector 120 will develop a current whose magnitude is dependent on the light emitted by the operating laser diode. In this way a feedback loop is established to maintain the proper threshold level current on line 115. Modulator circuit 404 is constructed so as to draw an additional increment of current from line 115 during each instant that a predetermined logic level is presented to input 104. In this present embodiment to be further described hereinafter, modulator circuit 404 will draw its additional increment of current when an ECL logic 0 is presented to input 104. It should readily be appreciated by those skilled in the art, however, that either logic level can be made to draw the additional increment of current by the modulator circuit.

In accordance with the present invention the output from photodetector 120 is also connected by way of line 114 to the input of a laser select circuit 408. It is this laser select circuit which is coupled by way of line 407 to the control input of selector switch 406. In the event that the selected laser should cease to emit optical radiation, the absence of an output from photodetector 120 causes laser select circuit 408 to automatically operate switch 406 thereby connecting another laser diode to the bias and modulator circuits. In this way the individual semiconductor laser diodes can be combined to provide a source of laser radiation having a greater extended lifetime than was heretofore possible in the prior art.

An additional feature of the present invention is that the entire laser source can be completely shut down by providing a logic 0 to input terminal 102 which logic 0 is connected by way of line 409 to the laser select circuit 408. In response to a logic 0 laser select circuit 408 couples a signal by way of line 410 to bias circuit 405 which in turn causes the bias circuit to completely remove the biasing current from the bank of laser diodes. Finally, an external switching control signal can be coupled to input terminal 103 which is connected to the laser select circuit 408 by way of a line 411 in FIG. 4. In the present embodiment a positive pulse at terminal 103 causes the laser select circuit 408 to operate the selector switch 406 by way of line 407 thereby causing a different laser diode to be selected in response to an externally provided supervisory signal in the event that some difficulty other than a complete failure is encountered with the operating laser diode.

Figure 5:
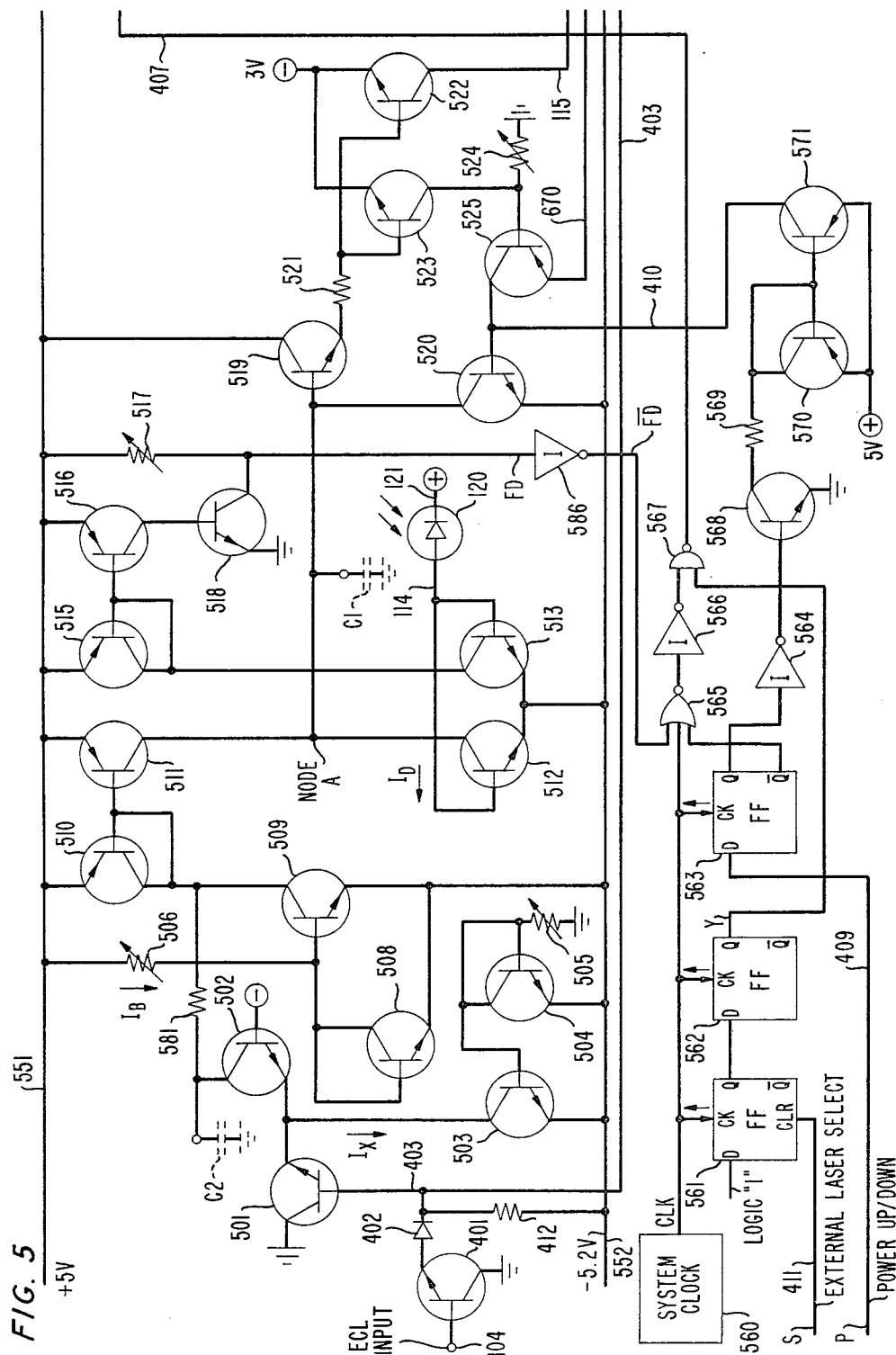

A detailed schematic diagram of the apparatus shown in FIG. 4 is shown in FIGS. 5 and 6 when these FIGS. are placed side-by-side in accordance with the pattern shown in FIG. 7. The devices and lines that have already been shown in FIG. 4 are given identical numerical designations in FIGS. 5 and 6.

In FIG. 6, a two-bit-positive-going edge-triggered counter 640 provides a two-bit code at the output designated as $Q_A$ and $Q_B$ which code is coupled to the input of a two to four decoder 641. Decoder 641 in turn translates this two-bit code into a logic 0 at one of its four output lines 651–654. The other three lines have a logic 1 or high positive potential. The anode terminal of each of the lasers 431–434 is connected through a Darlington pair to line 450 which provides ground potential. Only one of the Darlington pairs will be turned on so as to couple the anode of its corresponding laser through to ground potential. The +5 volts which is externally provided on line 551 is translated by elements 655–659 into a positive current on line 673 which is coupled to the emitters of transistors 623, 626, 629 and 632. The bases of these transistors are connected to the output lines of decoder 641 as shown in FIG. 6. When the output line of decoder 641 provides a logic 1 or high positive potential to the base electrode of one of these transistors, it serves to keep this transistor cut off. Only one of the four transistors is turned ON by the one output line of 641 that presents a logic 0. The corresponding base-emitter junction of the transistor to which this line is connected is forward biased thereby coupling a current into the base electrode of its corresponding Darlington pair. The power driver transistor of the Darlington pair (transistor 621, 624, 627 or 630) serves as a current source for its corresponding laser diode. Accordingly the output code provided by two-bit counter 640 determines which one of the laser diodes will have its anode terminal connected through to ground potential by way of line 450. Only this laser out of the for lasers available will be permitted to conduct the current that is drawn by the line connected to the cathode terminals of the laser diodes.

The input signal connected to terminal 104 is translated in potential by transistor 401, diode 402 and resistor 412 so as to provide an input signal on line 403 to the base of transistor 501 in FIG. 5 and to the base of transistor 601 in FIG. 6. In the discussion hereinafter the level of input signal that causes transistor 601 to be in conduction will be designated as a logic 0 in that this condition will cause a minimum of light output from the selected laser diode. Transistor 601 is emitter coupled to a transistor 602, and both transistors are connected to a current sink provided by elements 603–605. Setting the value of resistor 605 determines the magnitude of current $I_M$ that is drawn by transistor 603 down to a −5.2 volt source that is externally provided on line 552. Transistors 601 and 602 are not driven into saturation under either logic condition that is provided at the input and, therefore, they provided an extremely fast circuit for providing the modulation current developed by the input signal through to the cathode terminal of the selected laser diode.

Elements 606–614 are connected between ground potential and the −5.2 volt source on line 552 so as to provide a reference potential of about −2.6 volts at the base electrode of transistor 602. When a potential that is more positive than −2.6 is applied to the base electrode of transistor 601, the current $I_M$ is drawn through transistor 601 and no modulation current is coupled to the selected laser. If on the other hand, the potential at the base of transistor 601 is more negative than −2.6, the modulation current $I_M$ is drawn through transistor 602, and therefore, through the selected laser diode. In this way, the input signal at input terminal 104 modulates the light output from the selected laser diode between low light levels equivalent to a logic 0 and high output light levels equivalent to a logic 1.

The selected laser diode must be biased at the proper threshold current level, and this threshold current is provided to the selected laser by transistor 522 in FIG. 5. This threshold current through transistor 522 in turn is dependent on the current that is coupled into the base electrode of a transistor 519 from node A. When a logic 0 is presented at the input and transistor 601 is in conduction, transistor 501 in FIG. 5 will also be in conduction and, therefore, the current $I_X$ that is drawn by elements 503–505 into the −5.2 volt source on line 552 is entirely coupled through transistor 501. Accordingly, transistor 502 whose base electrode is connected to the −2.6 volt reference potential on line 674 of FIG. 6 will not conduct any of the current $I_X$ through resistor 581. Under this logic 0 condition a current $I_B$ that is established through elements 506 and 508 between the +5 volt potential source on line 551 and the −5.2 volt potential source on line 552 will be reflected through the current mirror provided by transistors 509, 510 and 511 so as to present this value of current $I_B$ into node A. Capacitor $C_2$ together with resistor 581 form a low-pass filter for currents drawn by transistor 502 so that the stability of the biasing circuit 405 is not adversely affected by rapid switching of transistor 502. The capacitor $C_2$ is external to the integrated circuit 101 and therefore has been shown in dotted line form in FIG. 5.

The photodetector 120 is back-biased by the positive potential on line 121 and develops a current on line 114 whose value is a function of the intensity of the light that is coupled to its active region. A half of this current, $I_D$, is coupled into the base electrode of transistor 512 and a value of current equal in magnitude to $\beta I_D$ is drawn out of node A by transistor 512. Accordingly a current equal to $(I_B - \beta I_D)$ is coupled into the base of transistor 519. This current is amplified by the $\beta$ of transistors 519 and 522 before serving as the threshold current of the selected laser diode. Since the light output of the selected laser is dependent on this current and since this current is in turn dependent on the light that is presented to photodetector 120, a feedback loop is established having a loop gain of $\beta^3 C_1/2$ where $C_1$ is the conversion efficiency of the laser photodetector combination for currents less than the threshold level. Assuming that the $\beta$ of all transistors is substantially equal and further assuming that the loop gain $\beta^3 C_1/2$ is much greater than 1, it can be shown that the laser output light level corresponding to a logic 0, $L_0$, is equal to $2I_B/\beta f$ where f is the detector conversion efficiency and $I_B$ is the current that is coupled through elements 506-508. The value of this current $I_B$ is adjusted by changing the value resistor 506. This resistor like other resistors shown in FIGS. 5 and 6 is indicated to be a variable resistor, but in practice these resistors would be fixed at some value that is dictated by the characteristics of the lasers and photodetector. They are shown to be variable only to indicate that they can be changed to compensate for different characteristics in these elements. Capacitor $C_1$, located electrically between node A and ground, forms a low-pass filter which stabilizes the biasing circuit by causing the loop gain to be reduced below unity at a frequency below which loop instability would occur. Capacitor $C_1$ is shown in dotted line form since it is located external to the integrated circuit 101.

If the biasing circuit were not responsive to the input signal a long string of digital ones in the input signal would cause the biasing circuit to try to lower the threshold current. The increased value of $I_D$ developed by this long string of digital ones would draw more current from node A thereby leaving less current to be coupled through transistor 519 and 522 as the threshold current. To compensate for this effect, the input signal is caused to couple the current $I_X$ from the current mirror provided by transistors 510 and 511 when a logic 1 is presented at the input terminal. The current that is drawn from the selected laser diode under the conditions of a logic 1 at the input terminal can then be shown to satisfy the following equation:

$$I_{L(1)} = \frac{\beta^2 I_B}{1 + (\beta^3 C_1/2)} + \frac{I_M + \beta^2 I_X}{1 + (\beta^3 C_2/2)} \quad (1)$$

The first term of this equation is, of course, the threshold current and the second term is introduced by the logic 1 in the input signal. It can be seen by this equation that if there is no input of the input signal to the biasing circuit, that is, if $I_X = 0$, then the modulation current $I_M$ is reduced by feedback by a factor of $1 + \beta^3 C_2/2$ where $C_2$ is the conversion efficiency of the detector-laser diode combination for currents greater than the threshold level. In order to insure that the low frequency operation of the circuit will be such that a long string of digital values will not influence the operating point, the value of $I_X$ is chosen to be equal to $\beta C_2 I_M/2$. Under these conditions the current for a logic 1 is given by the following equation:

$$I_{L(1)} = \frac{\beta^2 I_B}{1 + (\beta^3 C_1/2)} + I_M \quad (2)$$

This condition that is imposed on $I_X$ can also be verified through an AC analysis.

In summary, the circuit is matched to the characteristics of the laser diode and photodetector by first adjusting resistor 506 such that the proper threshold current for a logic 0 is provided at the selector diode. Resistor 605 is then adjusted in value so as to provide an increase in current on line 115 which will provide the level of light that is desired to represent a logic 1. Finally, resistor 505 is adjusted to provide a value of $I_X$ that is equal to $\beta C_2/2$ times $I_M$ in order to ensure that the low frequency performance of the circuit will not cause a shift in the operating point.

Transistors 520, 523 and 525 provide a laser turn-off and current limiting circuit. If the laser should age and develop a lower light intensity for a given current level, the reduced value of $I_D$ will permit more current to flow into the base of transistor 519 thereby creating larger current through transistor 522. If this condition should continue indefinitely, current levels could be sufficient in transistor 522 so as to seriously damage the remainder of the circuit. To prevent this the current that is coupled to the base of transistor 522 is also coupled to the base of transistor 523. Increased current in transistor 523 raises the potential across resistor 524 thereby decreasing the base emitter junction potential in transistor 525 whose emitter is connected by way of line 670 to a reference potential in FIG. 6. At a threshold determined by the value of resistor 524, current is coupled into the base of transistor 520 thereby causing this transistor to drain some of the current away from node A. In addition a current can be coupled by way of line 410 to the base of transistor 520 by a circuit to be described hereinafter. This current will drive transistor 520 completely into saturation thereby draining all of the current away from node A and preventing any of the biased current from reaching the selected transistor. In this way the selected laser can be shut down.

As pointed out hereinabove a total failure of the selected laser will cause the apparatus of the present invention to develop a positive pulse on line 407 at the input of the two-bit counter 640 which in turn will cause a different one of the four laser diodes to be connected through to ground potential by way of line 450. The current $I_D$ developed by photodetector 120 is also coupled to the base electrode of a transistor 513. Even with a minimal current that is developed during the logic 0 condition transistor 513 is sufficiently in conduction to develop a current that is mirrored by transistors 515 and 516 into the base electrode of transistor 518. With transistor 518 in conduction a logic 0 is presented on the failure detect line at the input of inverter amplifier 586. This presents a logic 1 at one input of NOR gate 565. This logic 1 is coupled through NOR gate 565 and is presented as a logic 0 at the input of inverter amplifier 566. As a result inverter amplifier 566 presents a logic 1 to one input of NAND gate 567. Without any positive signal on the external laser select line 411 the logic 1 at the D input of D-type flip-flop 561 is coupled during each clock period through D-type flip-flop 561 and 562 so as to present the other input of gate 567 with a logic 1. With logic 1's on both inputs of gate 567, a logic 0 signal is coupled by way of line 407 at the clock input of two-bit counter 640. Under these conditions no change in the laser diodes will occur.

With a total laser failure photodetector 120 no longer develops a current $I_D$ which is sufficient to keep transistor 518 in conduction. As a result, a logic 1 is developed on the failure detect line at the input of inverter amplifier 586. This logic 1 provides a logic 0 at one input of NOR gate 565. Assuming that a positive or logic 1 signal is provided on the power up/down line 409, the $\overline{Q}$ output of D-type flip-flop 563 also presents a logic 0 to another input of NOR gate 565. Consequently the next logic 0 pulse from the system clock 560 will cause a logic 1 to be developed at the input of inverter amplifier 566 which in turn will cause a logic 0 to be developed at one input of NAND gate 567. The resulting logic 1 on line 407 at the clock input of two-bit counter 640 will cause the two-bit code at the input of decoder 641 to be changed to the next value such that a different laser diode is selected for connection through to ground potential by way of line 450. The time between clock pulses from the system clock 560 permits the entire circuit to stabilize and develop a logic 0 signal on the failure detect line before the next logic 0 clock pulse from the system clock.

A different laser can also be selected by presenting the external laser select line 411 with a pulse that clears D-type flip-flop 561. This clear pulse presents the D input of flip-flop 562 with a logic 0 which in turn causes a logic 0 to appear at one input of NAND gate 567 during the next activating system clock pulse. This logic 0 will again cause the two-bit counter 640 to be clocked and switch a new laser diode into the circuit.

Finally, the apparatus of the present invention permits all of the laser diodes to be switched off by removing the logic 1 signal from the power up/down line 409 causing the Q output of flip-flop 563 to present a logic 0 to the input of inverter amplifier 564. This in turn drives transistor 568 into conduction. The resulting current through transistor 570 and resistor 569 is mirrored by transistor 571 and is presented as a current on line 410 into the base of transistor 520. This current drives transistor 520 into full conduction thereby removing all of the current from node A that would otherwise be coupled through to the laser diodes as a threshold biasing current.

We claim:

1. A light source for a communication system comprising a first semiconductor laser (431) for producing an output light the intensity of which is dependent on the value of current in the first semiconductor laser, a photodetector means (120) positioned with respect to said first semiconductor laser so as to develop an output current that is representative of the light intensity developed by said first semiconductor laser, means (405) for biasing said semiconductor laser at a threshold current in response to the output current of said photodetector means, means (404) for modulating current in said semiconductor laser in response to an input signal CHARACTERIZED IN THAT said light source further includes at least a second semiconductor laser (432), and means (406 and 408) for activating said second semiconductor laser and deactivating said first semiconductor laser.

2. A light source for a communication system as defined in claim 1 wherein said means (406 and 408) for activating said second semiconductor laser includes means (513, 515–518, and 586) responsive to a predetermined output from said photodetector means for activating said second semiconductor laser and deactivating said first semiconductor laser.

3. A light source as defined in claim 1 wherein said means (406 and 408) for activating said second semiconductor laser includes means (561, 562 and 567) responsive to a supervisory input signal for activating said second semiconductor laser and deactivating said first semiconductor laser.

4. A light source as defined in claim 1 wherein said means for activating includes a selective semiconductor switch (406), each of said first and second semiconductor lasers having a cathode and an anode terminal, one of said terminals being connected to said means for biasing and the other of said terminals being connected to a reference potential through said selective semiconductor switch.

5. A light source for a communication system comprising a plurality of semiconductor lasers, at least one photodetector means positioned such that it develops an output signal in response to the light generated by any one of said semiconductor lasers, a semiconductor switching means for selecting one of said semiconductor lasers by connecting the selected laser through to a reference potential, means for biasing the selected one of said semiconductor lasers with a threshold current level in response to the output signal from said photodetector means, means for modulating current in the selected one of said semiconductor lasers in response to an input signal, and means for selectively activating said semiconductor switching means so as to connect a different one of said plurality of semiconductor lasers through to said reference potential.

6. A light source for a communication system as defined in claim 5 wherein said means for selectively activating said semiconductor switching means includes means responsive to an output of said photodetector means so as to connect a different one of said plurality of semiconductor lasers through to said reference potential.

7. A light source for a communication system as defined in claim 5 wherein said means for selectively activating said semiconductor switching means includes means responsive to an externally provided supervisory signal so as to connect a different one of said plurality of semiconductor lasers through to said reference potential.

8. A light source for a communication system comprising a first semiconductor laser (406) whose output light level is dependent upon the current drawn through said first semiconductor laser, means (134, 406 and 450) for connecting one terminal of said first semiconductor laser through to a reference potential, a photodetector means (120) positioned so as to receive light from said first semiconductor laser and to develop an output signal in response thereto, means (405) for activating said first semiconductor laser by biasing the other terminal of said first semiconductor laser with a threshold current whose value is dependent on the output signal from said photodetector means, means (404) for modulating the current in said first semiconductor laser in response to an input signal CHARACTERIZED IN THAT the light source further includes at least a second semiconductor laser (432), and said means for connecting one terminal of the first semiconductor laser to a reference potential includes a semiconductor switch (405 and 408) for disconnecting said first semiconductor laser from said reference potential and connecting said second semiconductor laser through to said reference potential thereby activating said second semiconductor laser.

9. A light source as defined in claim 8 wherein said light source is CHARACTERIZED IN THAT the source further includes means (513, 515-518 and 586) for operating said semiconductor switch in response to the signal developed by said photodetector means.

10. A light source for a communication system as defined in claim 8 wherein said light source is CHARACTERIZED IN THAT the source further includes means (561, 562 and 567) for operating said semiconductor switch in response to an externally provided supervisory signal.

11. A light source for a communication system comprising a plurality of semiconductor laser diodes, a photodetector means positioned so as to develop an output current in response to light developed by any one of said semiconductor laser diodes, means for developing a threshold bias current in response to the output current from said photodetector means, means for developing a modulation current in response to digital values in an input signal, and means for selectively coupling the current from said biasing means and the current from said modulation means to one of said plurality of semiconductor laser diodes.

12. A light source as defined in claim 11 wherein said means for selectively coupling the biasing and modulation currents to one of said plurality of semiconductor diodes includes means responsive to the output current developed by said photodetector means for selectively coupling the current from the biasing means and the current from the modulation means to one of said plurality of semiconductor laser diodes, thereby permitting automatic selection of a different one of said plurality of semiconductor laser diodes in response to a failure of the initially selected semiconductor laser diode.

13. A light source as defined in claim 11 wherein said means for selectively coupling the biasing and modulation currents to one of said plurality of semiconductor laser diodes includes means responsive to an externally provided supervisory signal for selectively coupling the current from the biasing means and the current from the modulation means to one of said plurality of semiconductor laser diodes, thereby permitting a remote selection of a different one of said plurality of semiconductor laser diodes.

* * * * *